United States Patent
Kusunoki

(10) Patent No.: US 10,187,093 B2
(45) Date of Patent: Jan. 22, 2019

(54) POWER AMPLIFICATION APPARATUS FOR MASSIVE MIMO BASE STATIONS

(71) Applicant: Sony Mobile Communications Inc., Tokyo (JP)

(72) Inventor: Shigeo Kusunoki, Tokyo (JP)

(73) Assignee: SONY MOBILE COMMUNICATIONS INC., Tokyo (JP)

( * ) Notice: Subject to any disclaimer, the term of this patent is extended or adjusted under 35 U.S.C. 154(b) by 153 days.

(21) Appl. No.: 14/738,619

(22) Filed: Jun. 12, 2015

(65) Prior Publication Data
US 2016/0365906 A1 Dec. 15, 2016

(51) Int. Cl.
H04B 1/04 (2006.01)
H04B 7/0413 (2017.01)

(52) U.S. Cl.
CPC ......... *H04B 1/0475* (2013.01); *H04B 7/0413* (2013.01); *H04B 2001/0408* (2013.01)

(58) Field of Classification Search
CPC ................ H04B 2001/0441; H04B 2001/0425
See application file for complete search history.

(56) References Cited

U.S. PATENT DOCUMENTS

| | | | | |
|---|---|---|---|---|
| 3,009,641 A * | 11/1961 | Hinton | ................... | G06G 7/163 708/843 |
| 5,208,550 A * | 5/1993 | (Wane; Yasushi | ... | H03G 3/3042 330/129 |
| 5,353,011 A * | 10/1994 | Wheeler | ............ | G08B 13/2414 340/556 |
| 6,198,913 B1 * | 3/2001 | Sung | ................. | H04W 52/0241 340/10.33 |
| 2010/0329381 A1 * | 12/2010 | Shimizu | ................ | H04L 7/0008 375/293 |
| 2013/0147538 A1 * | 6/2013 | Oh | ......... | G06F 1/0307 327/346 |
| 2014/0084700 A1 * | 3/2014 | Anderson | ............. | H03F 1/0227 307/104 |
| 2015/0085944 A1 * | 3/2015 | Mobasher | ............ | H04B 7/0413 375/267 |
| 2015/0326285 A1 * | 11/2015 | Zirwas | ................. | H04B 7/0452 375/267 |

OTHER PUBLICATIONS

Fredrik Rusek, Daniel Persson, Buon Kiong Lau, Erik G. Larsson, Thomas L. Marzetta, Ove Edfors, and Fredrik Tufvesson "Scaling up MIMO", IEEE Signal Processing Magazine, Jan. 2013, pp. 40-60.

J.Shen, S.Suyama, T.Obara, Y.Okumura, "Impact on Nonlimear Distortion on Super High Bit Rate Massive MIMO Transmission Using Higher Frequency Bands", IEICE technical report, RCS2013-350 (Mar. 2014), pp. 265-270, (Japanese Edition).

* cited by examiner

*Primary Examiner* — Joseph A Bednash
(74) *Attorney, Agent, or Firm* — Xsensus LLP

(57) ABSTRACT

A Multi-Input Multi-Output base station includes a plurality of transmitter blocks. Each block includes a time-domain base band signal source circuit that generates an output, a low pass filter circuit coupled to the base band source circuit that filters the output of the base band source circuit, and a signal level adjuster circuit coupled to the base band signal source circuit and the low pass filter and that adjusts the output of the base band signal source circuit based on an output of the low pass filter.

13 Claims, 13 Drawing Sheets

POWER AMPLIFICATION APPARATUS FOR MASSIVE MIMO BASE STATIONS

BACKGROUND

Field

This disclosure is related with Multiple-Input Multiple Output (MIMO) wireless communication. Specifically, it is related to power amplification apparatuses for base stations in wireless communication systems which use massive MIMO.

Description of the Related Art

Presently, the amount of wireless communications via portable terminals is increasing explosively due to the proliferation of smart phones. Communication that is not between persons but rather is between apparatuses (machine-to-machine) is expected to be prevalent from now on, and it is expected that by 2020 machine-to-machine communications will double.

Research into new communication systems is ongoing in anticipation of the increased demand. Now, in addition to Long Term Evolution (LTE) research, research is ongoing into LTE Advanced (LTE-A) which further improves frequency utilization efficiency. LTE-A will be proposed as a 5th generation system for the 3rd Generation Partnership Project (3GPP). One of the leading techniques in LTE-A is massive MIMO (massive MIMO).

Massive MIMO is a transmission technique which uses many (for example, about 100) antennas in one unit of a base station, and communicates with multiple (for example 10) portable terminals simultaneously.

Massive MIMO can maintain stable communication, with high spectrum utilization efficiency and can tolerate noise and fading signal conditions. Moreover, massive MIMO affords channel capacity increases compared with conventional MIMO. For these reasons, massive MIMO is considered a leading next-generation technology.

Although massive MIMO was first proposed around 2010 in a thesis, research which estimated the utilization was not published until the middle of 2013. In massive MIMO, in the case that there are a number K of terminals (for example K is about ten units) and each bases station (BS) has a number M (for example about 100) antennas, the channel matrix H becomes K by M in size. When each signal vector is multiplier by $H^H$ (H is a channel matrix and superscript "H" denotes the conjugate-transpose operation on the matrix) as a way of precoding at the time of the transmission on the downlink (DL) path from the BS to the terminal, the signal received at the terminal will be modelled as $H*H^H*$.

The non-diagonal elements of the correlation matrix $H*H^H$ is small compared with a diagonal element of the correlation matrix, if the correlation between different channels is low.

As a result, the terminal can receive a self-oriented signal without performing diagonalization etc. Moreover, since the noise superimposed on the channel has low auto/cross-correlation, the noise is also reduced by the correlation matrix and reception which is influenced by signal noise (SN) to a lesser extend is achieved as a result.

Power amplifier (PA) distortion can reduce channel capacity, degrading a through-put. One solution has been to address the problem and lower the distortion has been to back off of the operating point of the PA. This method has problems are associated with it. Firstly, the amplifier output falls when the operating point is backed off. In order to avoid this and to maintain the output, it is necessary to increase the saturation power in order to achieve the back off. However, when this is done, a large size PA is needed. Even if back off is implemented and the saturation power is increased, a decline in efficiency occurs. A back off of 1 dB, leads to an efficiency that may reach to tens of percentage points which is unacceptable.

Because 100 or more power amplifiers operate simultaneously in massive MIMO systems, the decline in efficiency of all of the power amplifiers makes the power consumption in the whole base station increase, and produces large environmental problems, such as the generation of waste heat.

SUMMARY

The inventor recognized the necessity for proposing a new technique which can solve the above described problems with the power amplification apparatus for base stations in the wireless communications systems which utilize massive MIMO transmission.

According to exemplary aspects, each power amplification block of a massive MIMO systems includes: a low pass filter (LPF) which generates an average value of the input voltage; a comparator circuit which compares the average value with a predetermined reference value; and a multiplier which changes the amplitude of the input voltage according to predetermined amplitude change coefficient when the output of the comparator circuit indicates that the average value of the input voltage exceeds the said reference value.

The average voltage at the input of each power amplifier on the transmission side of a massive MIMO base station is detected. An input signal suppression is implemented when the power amplifier receives an average input voltage that is more than a predetermined level. In order to reduce the distortion accompanying this signal suppression, the amplitude of the input voltage to that PA is changed according to a limited predetermined amplitude change coefficient. The distortion of the signal regenerated at the receiving side of the system is corrected, and the channel capacity can be recovered while improving on the deterioration of interference removal operation that is due to amplifier saturation.

According to another exemplary aspect, a Multi-Input Multi-Output base station includes a plurality of transmitter blocks. Each block includes a time-domain base band signal source circuit that generates an output, a low pass filter circuit coupled to the base band source circuit that filters the output of the base band source circuit, and a signal level adjuster circuit coupled to the base band signal source circuit and the low pass filter and that adjusts the output of the base band signal source circuit based on an output of the low pass filter. According to a further exemplary aspect, a Multi-Input Multi-Output system includes circuitry that generates an output signal, low pass filters the output signal to generate a filtered output signal, and adjusts the output signal based on the filtered output signal.

According to another exemplary aspect, A method for each of a plurality of transmitter blocks in a Multi-Input Multi-Output base station includes generating, with circuitry, a reference voltage, generating, with the circuitry, a plurality of multiplier signals, and determining, with the circuitry, one of the plurality of multiplier signals with which to adjust the output signal based on the filtered output signal.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
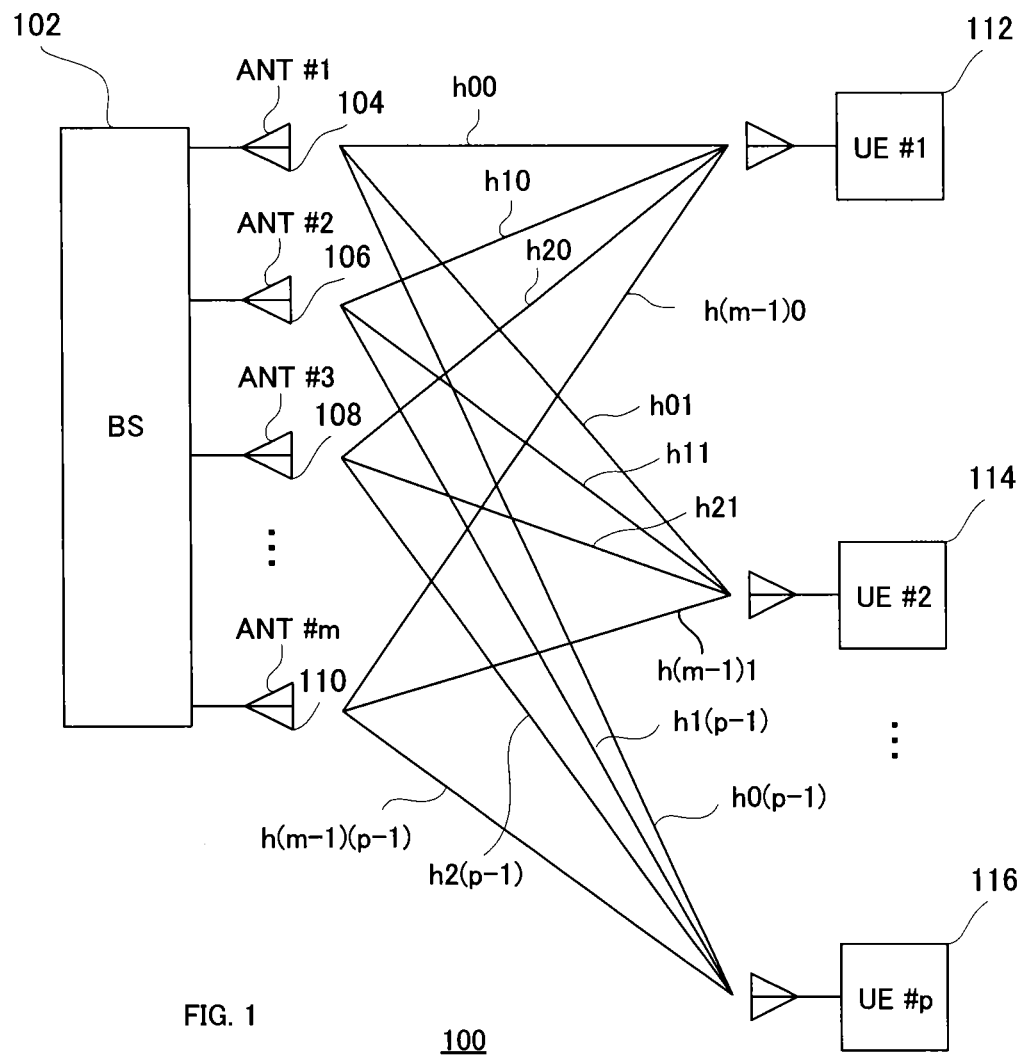
FIG. 1 is a block diagram of the structure of a wireless communications system which uses massive MIMO according to exemplary aspects of the present disclosure.

Referring now to the drawings, wherein like reference numerals designate identical or corresponding parts throughout the several views. FIG. 1 is a block diagram of the structure of a wireless communications system 100 which uses massive MIMO. The system 100 includes a base station (BS) 102 that has many transmit antennas 104, 106, 108, 110 including a first transmit antenna 104, a second transmit antenna 106, a third transmit antenna 108 and an $M^{TH}$ transmit antenna 110 which are also labeled Ant#1 to Ant#m. Although only four transmit antennas 104, 106, 108, 110 are shown in FIG. 1 to avoid crowding the drawing, the number of transmit antennas can be, and often, is higher. According to one exemplary embodiment the number of transmit antennas denoted M is equal to or greater than 100. However other numbers if antennas are possible without departing from the scope of the present disclosure.

The wireless communication system 100 includes a number, denoted P of terminals 112, 114, 116 including a first terminal 112, a second terminal 114 and a $P^{TH}$ terminal 116. The terminals 112, 114, 116 are also referred to as "user equipment" and are also labeled UE#1-UE#p in FIG. 1. Although only three terminals 112, 114, 116 are shown in FIG. 1 to avoid crowding the drawing, the number of terminals can be much higher as one of ordinary skill would recognize.

According to one exemplary aspect, each base station 102 serves about 10 terminals (e.g., 112, 114, 116). Each of the M transmit antennas 104, 106, 108, 110 is connected to each of the P terminals 112, 114, 116 through a signal path. Each signal path is labeled by the letter h followed by two integer indexes, where the first integer index denotes the base station antenna and the second integer index denotes the terminal. The integer indexes start at zero for the first antenna 104 and the first terminal 112.

Orthogonal frequency-division-multiplexing (OFDM) is used for downlink (DL) communication and can be used for uplink (UL). Other communication schemes are also possible without departing from the scope of the present disclosure.

Figure 2:
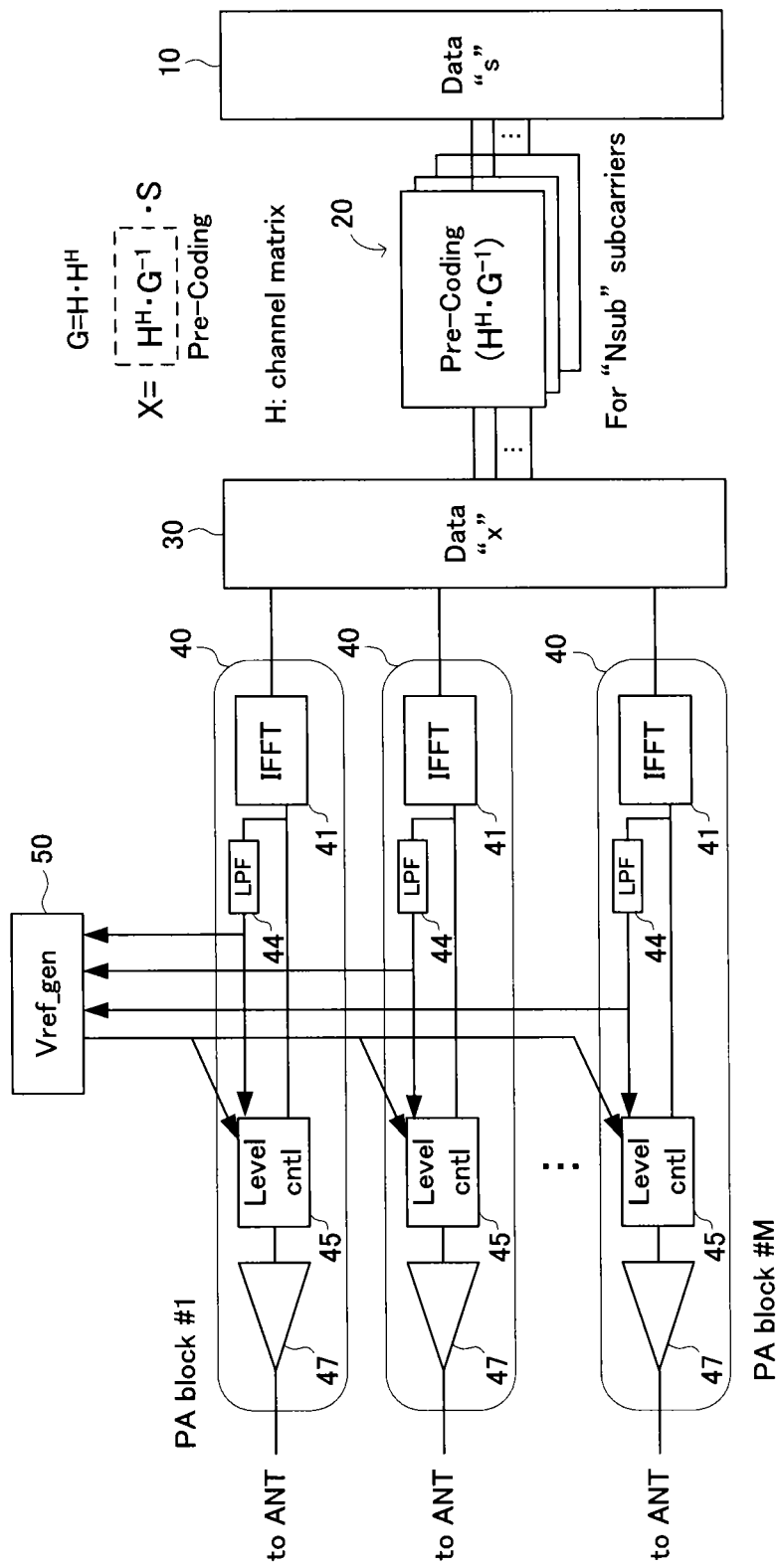
FIG. 2 is a block diagram of a schematic structure of a transmitter of the base station of the system shown in FIG. 1 according to exemplary aspects of the present disclosure.

FIG. 2 is a block diagram which shows a schematic structure of a transmitter 200 of the base station 102 according to an embodiment. In FIG. 2, data "S" 10 is the data to be transmitted to a terminal (e.g., 112, 114, 116). The data stream includes K segments each of which is to be transmitted to one subscriber unit. Each $K^{TH}$ segment of the data stream is pre-coded by pre-coding block 20 according to equation (2) given herein below. The pre-coding block 30 supplies output data X identified by reference numeral 30 in FIG. 2. Data X is coupled to a set of M (integer value) power amplifier circuit blocks 40 each of which drives one of the transmit antennas 104, 106, 108, 110 (of FIG. 1)

Power amplifier circuit block 40 includes an inverse fast Fourier transform part (IFFT) 41 which carries out inverse fast Fourier transform of the data "X" received from block 30, and produces a separate baseband time-domain signal for transmission for each of the power amplifier circuit blocks. An IFFT output is distributed into two signal paths and one of these is input into an input of a low-pass filter (LPF) 44. The signal path from the IFFT 41 is also input into the input of a signal level adjuster (Level_cntl) 45. An output of the low pass filter 44 from each of the power amplifiers blocks 40 is coupled to a single common reference voltage generator circuit (Vref_gen) 50.

The reference voltage generator circuit 50 calculates an average value of the output of all the low pass filters 44 (each within a different power amplifier circuit block), and generates a set of reference voltages (reference values) which are spaced by a predetermined voltage difference and are centered around the average value. That is, the average voltage of the output of low pass filters 44 of M power amplifier circuit blocks 40 is calculated and a number N of different reference voltages Vref are generated from this average voltage, and are coupled to the signal level adjuster 45 in each power amplifier circuit block 40. The other output of low pass filter 44 is input into signal level adjuster 45. An output of the signal level adjuster 45 is input into power amplifier 47.

Figure 3:
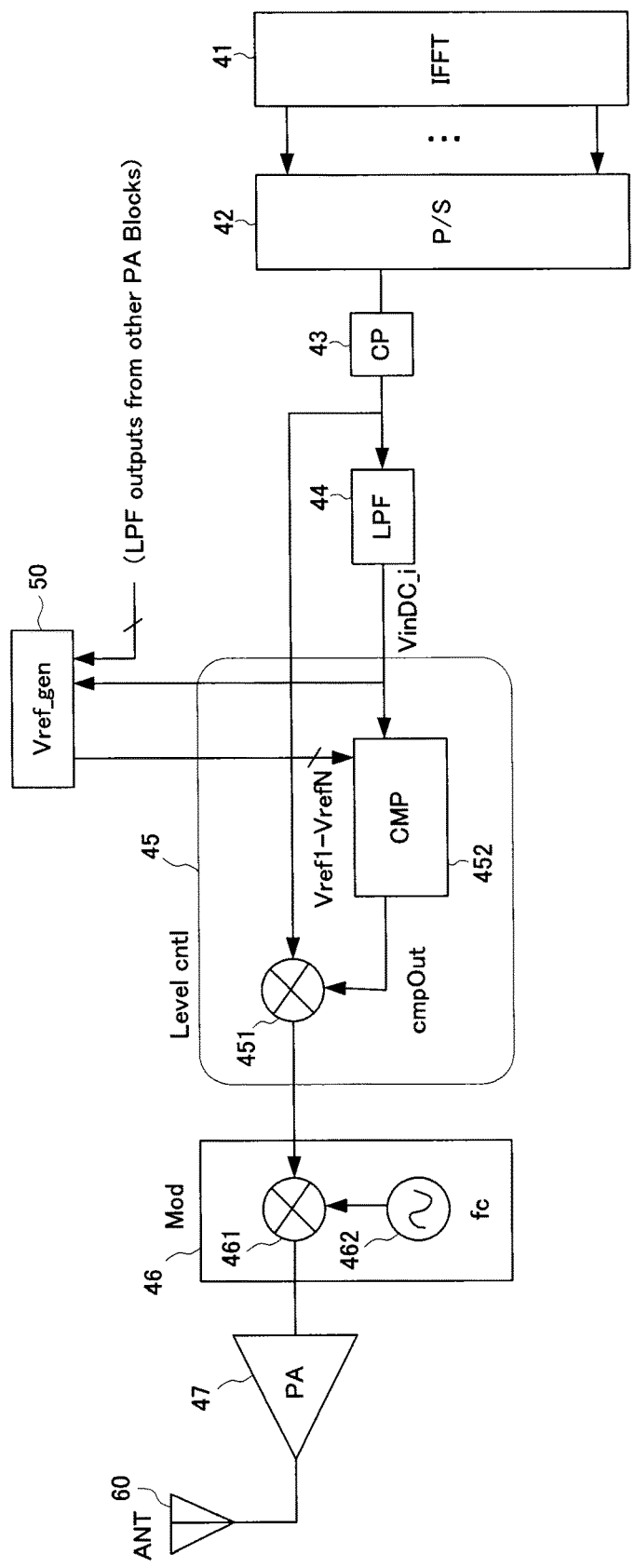
FIG. 3 is a block diagram of a more detailed schematic of a power amplifier circuit block used in the system of FIG. 2 according to exemplary aspects of the present disclosure.

FIG. 3 shows further details of each power amplifier circuit block 40 shown FIG. 2 according to an embodiment of the invention. The parallel-serial conversion of the output of the IFFT 41 is carried out by a parallel-to-serial converter (P/S) 42. A cyclic prefix is added to the parallel-to-serial converter 42 output by a cyclic prefix adder (CP) 43. The output of the cyclical prefix adder 43 is coupled to the signal level adjuster 45, and is input into low pass filter 44 which extracts a direct current part. The direct current part Vin-DC_i (i=1–M) extracted by low pass filter 44 is coupled to the signal level adjuster 45 and to the reference voltage generator circuit 50.

Within the reference voltage generator circuit 50, a number N of reference voltages Vref1–VrefN are calculated based on the average value of LPF output VinDC_i (i=1–M) of the M different amplifier circuit blocks as discussed above. These N different reference voltages are used as reference voltages of the level comparator circuit (CMP) 452 in each signal level adjuster 45. The number of reference voltages N can equal one or more than one, for example three or any other number as one of ordinary skill in the art would recognize. Within the level comparator circuit 452, a comparison with each of the reference voltages Vref1–VrefN and VinDC_i (i=1–M) is performed.

An amplitude change coefficient that is prepared in advance is output as a cmpOut signal from the level comparator circuit 452. The multiplier 451 multiplies the cmpOut signal of the level comparator circuit 452 which manifests this amplitude change coefficient by the output of the cyclical prefix adder 43. The multiplication result becomes a level-controlled output. The level-controlled output is a baseband information signal. The level-controlled output is input into a modulating circuit (Mod) 46 which is the next stage of the power amplifier circuit block 40 after the signal level adjuster 45.

The modulating circuit 46 includes an oscillator 462 which produces a reference signal at a frequency $f_c$. The modulating circuit 46 also includes a multiplier 461 which is coupled to the oscillator and receives the references signal therefrom. The level-controlled signal output by the signal level adjuster 45 is also coupled to the multiplier 461. The multiplier 461 performs modulation and frequency shifts the level-controlled signal according to the reference frequency $f_c$.

A power amplifier 47 is the next stage of the power amplifier circuit block 40 following the modulator 46. The multiplier 461 of the modulator 46 includes an output which is coupled to an input of a power amplifier 47. The modulated signal produced by the multiplier 461 is coupled from the output of the multiplier 461 to the input of the power amplifier 47. The output of the power amplifier 47 is coupled to an antenna 60 so that signals output by the power amplifier can be emitted into free space.

Because massive MIMO transmitters use a large number N of antennas, the transmit power per antenna is 1/N compared with a single antenna transmitter and therefore the design of each transmitter circuit is simplified. However, the antenna outputs of the present base station are 43 dBm in general, and the efficiency of power amplifier used is about 40%. When considering using massive MIMO, total transmission power and the power consumption (namely, efficiency) needs to maintain the same value as in the case of a single antenna. Therefore, when 100 transmission circuits are provided in a base station, the transmission power of the power amplifier per transmission circuit becomes 1/100, i.e., 43 dBm−20 dBm=23 dBm. Because this value is the antenna transmission power, when the high frequency electric power loss from the power amplifier output to an antenna is considered, a desired power amplifier output is 25 dBm–27 dBm. Therefore a power amplifier of the type used for a portable terminal is a potential choice for a massive MIMO base station and can satisfy these requirements. A power amplifier for portable terminals has a size as small as 3 square mm and its price is also relatively low at about 50 yen (US $0.41) at present. Therefore, when implementing massive MIMO with 100 or more transmitters, it is a very strong candidate. However, other power amplifier designs are also possible without departing from the scope of the present invention.

The issue of distortion also needs consideration. The input voltage to a power amplifier is dependent on the fluctuation of the signal envelope due to modulation. This fluctuation contains an essential part determined by the modulation system, and a part determined by precoding of the zero forcing which are used in massive MIMO.

Figure 4:
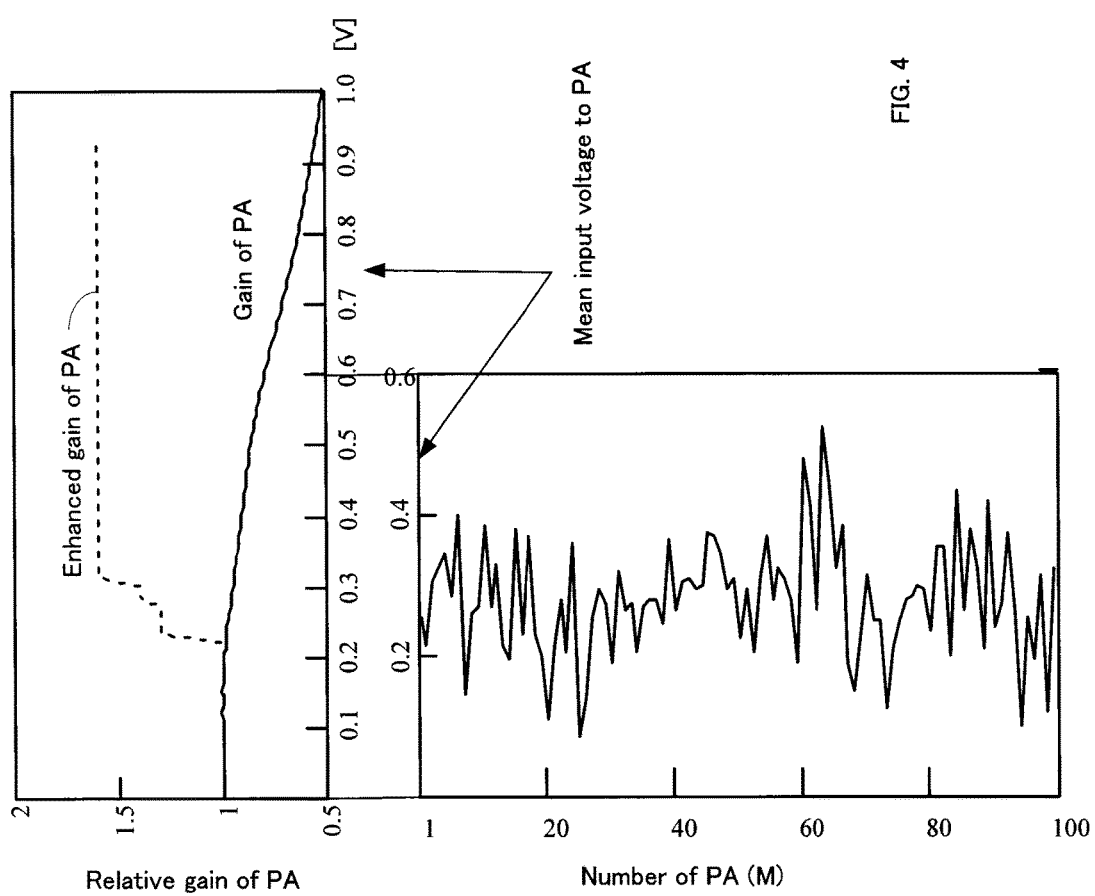
FIG. 4 is an associated set of graphs including a upper graph of relative gain versus mean input voltage for a typical power amplifier used in a massive MIMO transmitter and a lower graph showing a distribution of mean input voltage across a set of power amplifiers in a massive MIMO transmitter according to exemplary aspects of the present disclosure.

The upper part of FIG. 4 is a graph including a first (solid line) plot of relative gain versus mean input voltage for a power amplifier used in a massive MIMO transmitter according to an exemplary embodiment of the present disclosure. The broken line plot in the upper part of FIG. 4 represents the gain (Enhanced gain) which is enhanced at high input voltages in this embodiment.

The lower part of FIG. 4 is a distribution of mean input voltage across a set of power amplifiers in a massive MIMO transmitter corresponding to the case in which zero forcing is performed. The average value of input voltage across the set power amplifiers differ, and there exists a dispersion of 0.1V to 0.5V as shown in the lower part of FIG. 4. This dispersion corresponded to about 7 dB in terms of electric power range. FIG. 4 shows that the power amplifier are typically operating nonlinearly.

Figure 5:
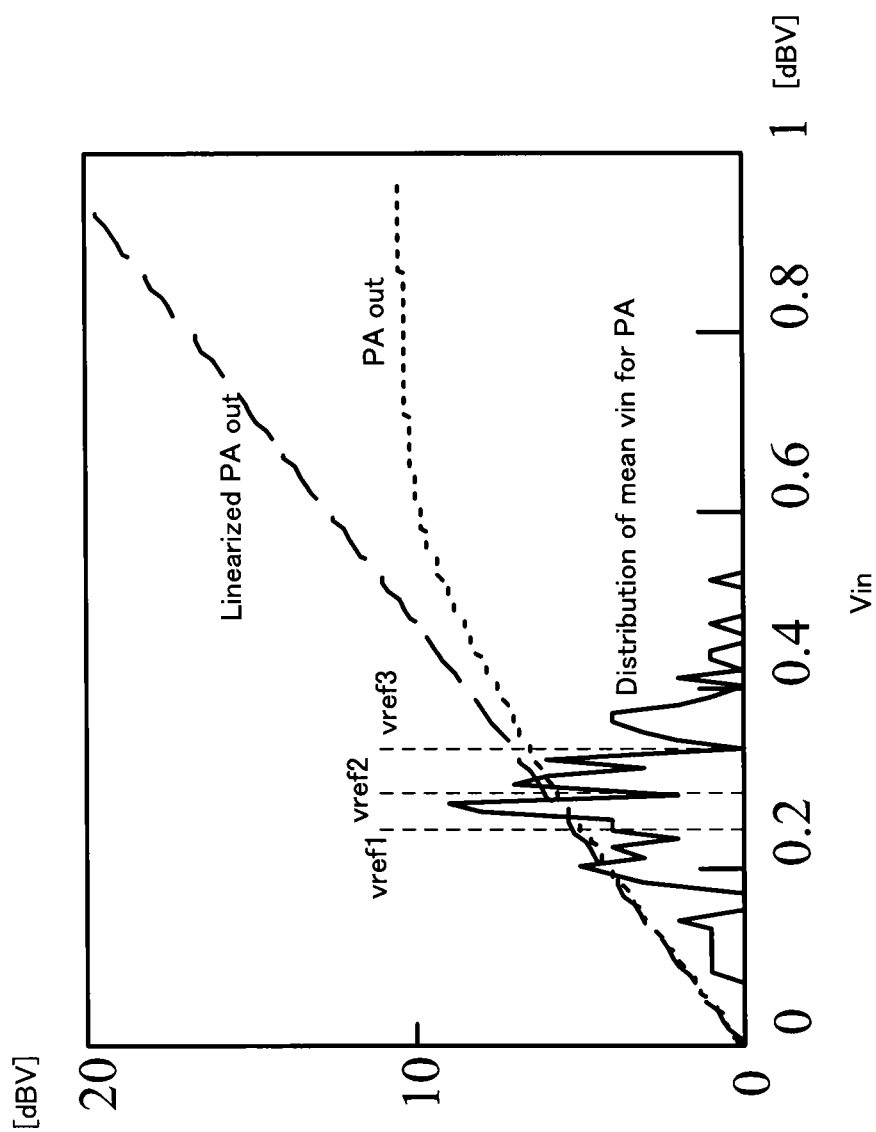
FIG. 5 is a graph including a plot of an ideal linear response of a power amplifier, an actual nonlinear response of a power amplifier and a distribution of input voltages for an amplifier used in a massive MIMO system according to exemplary aspects of the present disclosure.

FIG. 5 is a graph including three plots. The abscissa of the plot indicates amplifier input voltages in volts. The ordinate of the graph shows output voltage in dBV. A first plot (large dashes) shows a linearized response of a power amplifier. A second plot (small dashes) shows the typical nonlinear response of a power amplifier. The ordinate applies to the first and second plots. A third plot (solid) lines shows the distribution of mean input voltage for a power amplifier in a massive MIMO system according to an exemplary embodiment of the present disclosure. For the third plot the ordinate is the probability density of the distribution.

Since the operating range of each power amplifier has a range of 7 dB in input, the distortion which is generated in the power amplifier differs significantly for every power amplifier. Since the transmitted signal is synthesized and received at a receiving end, it can be estimated that the behavior becomes extremely complex.

There is a tradeoff relationship between distortion and efficiency. Distortion can include frequency components both outside and inside of the transmission band. Although the distortion outside the transmission band is removable by a filter at the receiver, the in-band distortion is not removable by such a filter. Although the in-band distortion degrades modulation quality, in massive MIMO, a completely different deleterious effect from in-band distortion also occurs.

The input-output characteristics of a power amplifier can be expressed as an amplitude-to-amplitude modulation (AM/AM) characteristic and an amplitude-to-phase modulation (AM/PM) characteristic.

Although these input-output characteristics exhibit a linear relationship in the range of a small signals, they become nonlinear for large signal ranges. That is, even if it is a power amplifier of small signal gain G[dB], a gain suppression term (dlt[dB]) appears at high amplifier outputs. The gain becomes G[dB]-dlt[dB]. This is shown in FIG. 6.

Figure 6:
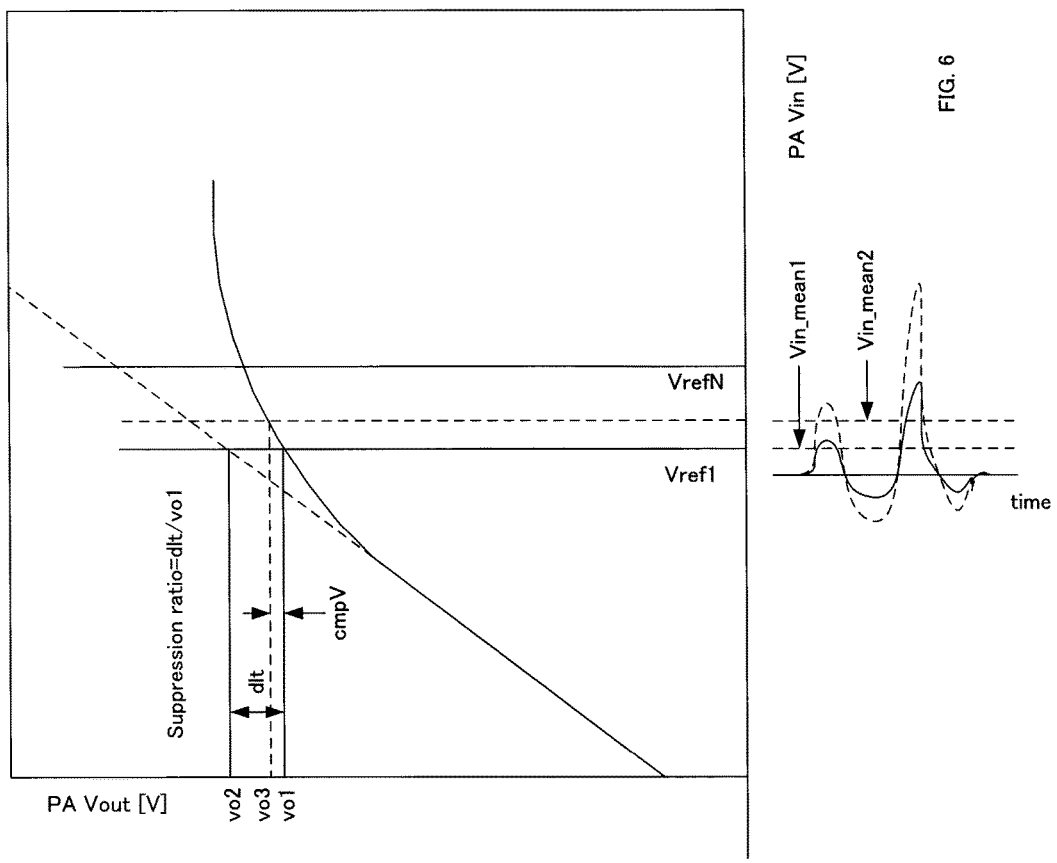
FIG. 6 is graph of signal suppression and recovery associated with power amplifier distortion according to exemplary aspects of the present disclosure.

FIG. 6 is an explanatory drawing of signal suppression and recovery in a system with power amplifier distortion. The graph of FIG. 6 shows the typical AM/AM characteristic of a power amplifier by itself as used in an embodiment of the invention. All the units are voltages ([dBV]). The large-dashed line in FIG. 6 shows the change of power amplifier output in the case of a linear amplification, and a solid line shows the change of the power amplifier output PA out in actual amplification. Referring to FIG. 6, in the case that the power amplifier input voltage vin=Vref1, if the power amplifier were ideally linear the output voltage would be at a level vo2. In actuality the output voltage will be set to vo1 which is reduced by a small amount dlt [V].

That is, at the power amplifier output, the fundamental wave component of the signal is not identical to the signal at the power amplifier input, rather it is suppressed and appears distorted. When the transmitted signal is demodulated at the receiver to obtain the baseband signal again, the distorted waveform is regenerated which means that its peak value becomes lower by dlt [V] relative to the transmitted signal. Furthermore, since the value of dlt changes with transmission power, an estimation of dlt is impossible.

The suppression of the power amplifier output means that the value of a corresponding element of the channel matrix is reduced by dlt. Because dlt changes with transmission power, a channel will have electric power dependence. Usually, in massive MIMO, a zero forcing (ZF) and a dirty paper coding (DPC) are applied for the interference removal at the receiving side, However, these techniques are premised on the supposition that the channel is constant. This aspect is again explained with reference to FIG. 2. As mentioned above, data "S" of FIG. 2 becomes data "X" by pre-coding. As shown in FIG. 2, when a Gram-Schmidt matrix is represented as follows with respect to the channel H, $$G = H * H^H \tag{1}$$

$H^H * G^{-1}$ is used for pre-coding to obtain the pre-coded vector X from the data S according to the following equation.

$$X = H^H * G^{-1} * S \tag{2}$$

When this signal is transmitted through the channel characterized by H and is received, it turns out that the received signal Y becomes the following and it is received correctly.

$$Y = H * H^H * G^{-1} * S = G * G^{-1} * S = S \tag{3}$$

Here, when waveform suppression due to distortion caused by the power amplifier occurs, formula (3) changes to the form shown in formula (4) shown below which includes a diagonal matrix D which has a suppression dlt by each power amplifier in the diagonal elements.

$$Y = H * D * H^H * G^{-1} * S \tag{4}$$

By the interposition of the diagonal matrix D, since $G^{-1}$ of (4) formula is not an inverse matrix of $H * D * H^H$, diagonalization is no longer correctly carried out at the receiving side. Interference is produced, and the channel capacity deteriorates.

The channel matrix H is calculated in the normal process of channel estimation. A reference signal (pilot signal) is used in the case of channel estimation, and the ratio of the received and transmitted baseband is used to measure the channel. There are at least two ways of carrying out the channel estimation. One way is to transmit the pilot signal from the terminal, receive it in the base station, and perform the channel estimation in the base station. Another approach is to transmit the pilot signal from the base station, performs channel estimation in the terminal and transmit channel estimates back to the base station. Transfer characteristics of the transmitter and receiver are also included along with the space transfer function (So-called, a path loss, a shadowing, a fading) in the channel estimates. Because the power amplifier of the base station is used per the first approach, the first approach performs separate calibration to model the power amplifier.

The suppression of the signal voltage due to distortion caused by the power amplifier does not foster channel regularity, and has a negative influence which disturbs interference removal operations. The increase in interference causes deterioration of a channel capacity. Control of the power amplification apparatus for solving such a problem is explained. An outline is explained first.

Referring again to FIG. 6, suppose that the power amplifier input is a signal of average value Vin_mean1=Vref1. The power amplifier output for this signal is vo1. The amount of the voltage suppression is vo2−vo1=dlt[v]. Now, suppose that the power amplifier input is multiplied by a coefficient which increases it to an average value Vin_mean2. The power amplifier output will be changed to vo3. The power amplifier output has recovered by vo3−vo1=cmpV[V]. This makes the corresponding element of the matrix D in the formula (4) above approximate "1" more closely, and improves the effectiveness of the diagonalization operation by inverse-matrix $G^{-1}$ in formula (4). That is, originally, if D=unit matrix, the interference by distortion will not occur. D can be brought closer to being the unit matrix by multiplying the input to the power amplifier by a coefficient in order to compensate for the drop in the power amplifier gain.

Presently a more detailed account of the functioning of the system will be given.

First, the operation of the reference voltage generator circuit 50 is explained. Per the embodiment shown in FIG. 2, a direct-current component (denoted VinDC_i) of each IFFT 41 output (denoted Vin_i, where index i identifies an amplifier circuit block and ranges from 1 to M, the number of amplifier circuit blocks which may for example be 100) is extracted by the low pass filter 44, and is input into the reference voltage generator circuit (Vref_gen) 50.

The following is computed in the reference voltage generator circuit 50.

$$Vin\_mean = E(VinDC\_i) = (Vin\_1 + \ldots + Vin\_M)/M \tag{5}$$

Here, E (−) symbolizes an averaging function. By this embodiment, three types of reference voltages Vref1 to Vref3 defined in equations (6-1) to (6-3) are generated based on the Vin_mean value.

$$Vref1 = Vin\_mean - 0.2/K \text{ [V]} \tag{6-1}$$

$$Vref1 = Vin\_mean \text{ [V]} \tag{6-2}$$

$$Vref3 = Vin\_mean + 0.12/K \text{ [V]} \tag{6-3}$$

(While the choice of generating three reference voltages is a suitable choice, according to alternative embodiments a different number of reference voltages are generated.)

Here, the variable K represents a terminal number. −0.2/K and +0.12/K are the constants prepared in advance based on experiments or system modeling.

Although the number reference voltages Vref is set to three, if there is at least one reference voltage, step-wise control of the power amplifier input according to the magnitude of the power amplifier input will be achieved. Referring again to FIG. 3, in each power amplifier circuit block 40 the amplitude change coefficient by which input voltage is made to increase. For each $i^{TH}$ amplifier circuit block, the output of the comparator circuit 452 is set to a value selected based on comparison of the low pass filter output VinDC_i to the reference voltages generated by the voltage reference generator 50. More specifically, each power amplifier circuit block 40 performs the following exemplary algorithmic operation according to the comparison result of the low pass filter 44 output VinDC_i, and the reference voltages Vref1–Vref3.

(0) At time if VinDC_i<Vref1
The comparator circuit 452 produces a cmpOut output signal specifying a default amplitude change coefficient of dlt_0.
(1) At time of Vref1<=VinDC_i<Vref2
The comparator circuit 452 produces a cmpOut output signal specifying a default amplitude change coefficient of dlt_1.
(2) At time of Vref2<=VinDC_i<Vref3
The comparator circuit 452 produces a cmpOut output signal specifying a default amplitude change coefficient of dlt_2.
(3) At time of Vref3<=VinDC
The comparator circuit 452 produces a cmpOut output signal specifying a default amplitude change coefficient of dlt_3.

These dlt_* change coefficients correspond to signal amplitude recovery amounts cmpV and give the effect of recovering suppressed power output. The number of objects and the values of dlt_* corresponding to the number of objects of Vref can be selected set in advance based on experiment or system modelling.

Figure 7:
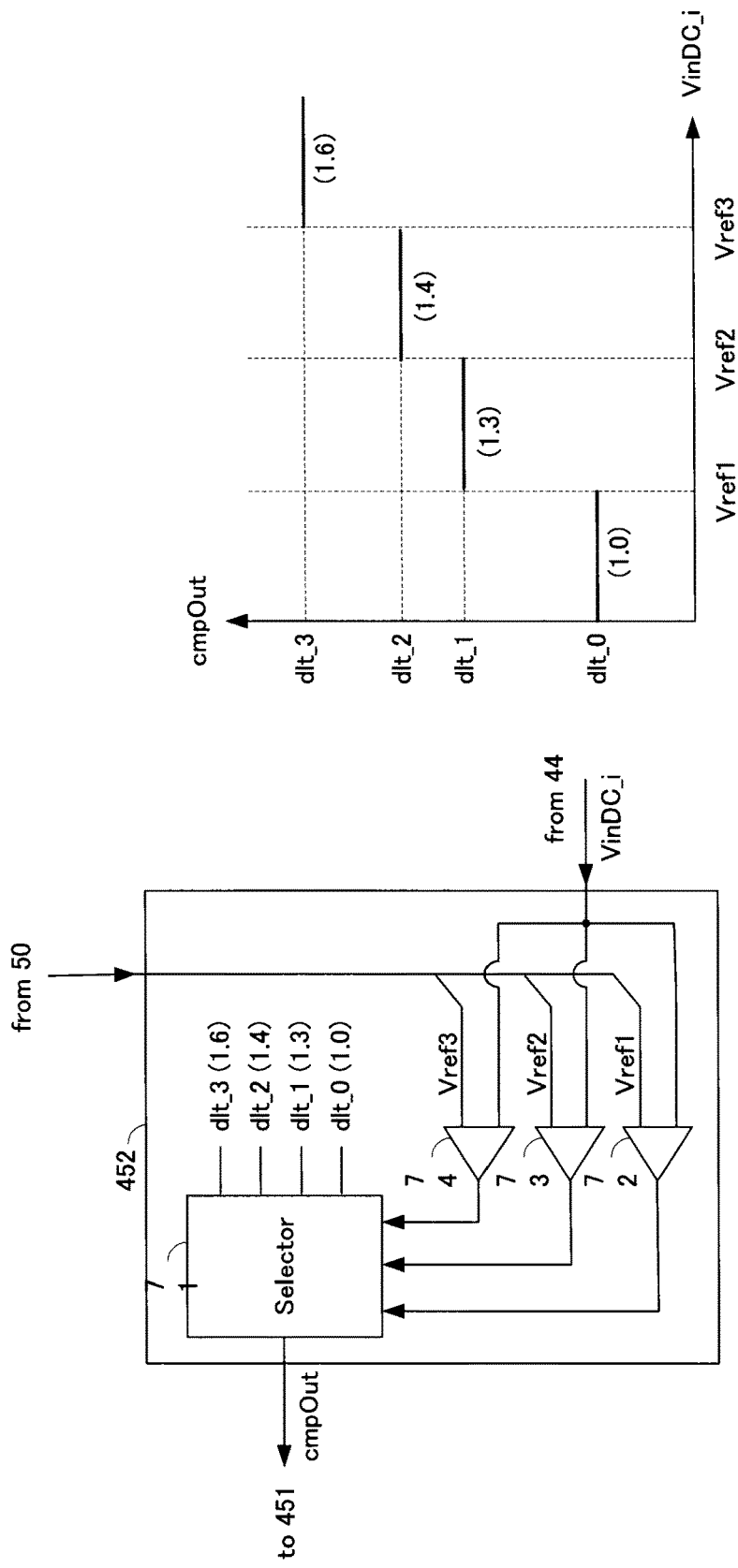
FIG. 7A is block diagram of a comparator circuit included in the power amplifier circuit block of FIG. 3 according to exemplary aspects of the present disclosure.
FIG. 7B is explanatory drawing of how the state of the comparator circuit output of the comparator circuit of FIG. 7A changes in steps according to exemplary aspects of the present disclosure.

FIG. 7A is block diagram showing the comparator circuit 452 that is included in the power amplifier circuit block 40 per the embodiment shown in FIG. 3. Comparator circuit 452 includes three internal comparators circuits 72, 73, 74 including a first internal comparator circuit 72, a second internal comparator circuit 73 and a third internal comparator circuit 74. Each of the internal comparator circuits 72, 73, 74 includes a first input terminal and a second input terminal. The first input terminal of each internal comparator circuit 72, 73, 74 is coupled to the output of the low pass filter 44. The second terminal of each internal comparator circuit 72, 73, 74 is coupled to the reference voltage generator circuit 50. As shown in FIG. 3 a connection between the reference voltage generator circuit 50 and the comparator circuit 452 includes a number, N lines corresponding to the number of reference voltages. Each of the internal comparator circuits receives one of the reference voltages produced by the reference voltage generator circuit at its second input. In response to the applied inputs, the internal comparator circuits produce a three bit pattern. The outputs of the internal comparator circuits 72, 73, 74 are coupled to a set of selection inputs of a selector (multiplexer) 71. A set of signal multiplication coefficients (voltage signals) are coupled to a set of four data inputs of the selector 71. Based on the bit pattern present on the selection inputs the selector 71 passes one of the multiplication coefficients to an output of the selector 71 which serves as an output of the level comparator circuit 452.

The cmpOut signal output from level comparator circuit 452 changes between dlt_0–dlt_3 in steps according to the change of VinDC_i by making each of the reference voltages Vref1–Vref3 into a threshold value, as shown in FIG. 7B. The value of coefficients dlt_–dlt_3 are set such that the output of the level comparator circuit increases as VinDC_i increases.

The benefits of the first embodiment that are demonstrated by simulation are discussed below. First, the power amplifier to be used is explained. The type of power amplifier that is used in portable terminals is sufficient for the massive MIMO transmitter used in this embodiment. At a biasing voltage of 3.5 V the efficiency is about 40% and the OFDM output is 24 dBm. The saturation powers is 30.6 dBm. The size of the power amplifier is 3 mm×3 mm×1 mm. The price is about 50 yen ($0.41). The semiconductor used is InGaP—GaAs-HBT. In this embodiment, this power amplifier circuit was measured to obtain the actual value of AM/AM and AM/PM. It is assumed that all of 100 power amplifiers had the same characteristics for the simplicity.

The system model includes four terminals (each terminal has one receiving antenna) placed at random within a radius of 500 m from the base station, and it is assumed to be the case that there are 100 random scattering points in the vicinity of each a terminal.

Referring again to FIG. 4 as above-mentioned, the lower graph of FIG. 4 shows the average (VinDC_i, i=1–100) of each power amplifier circuit input voltage assuming that there are 100 power amplifiers in each BS. Due to pre-coding, each power amplifier input shows a different average voltage. The input to each power amplifier changes significantly, and is generally distributed over 0.4V from 0.2V. The continuous line of the upper graph of FIG. 4 shows the gain suppression for the power amplifier. As shown the gain suppression has begun from input voltage in the vicinity of 0.15V. The upper graph of FIG. 4 shows that most voltages input into PA are amplified in a gain suppression range. In the case of this embodiment, with the average output of all the power amplifier being 26 dBm, the reference voltages were set as follows Vref1=0.22V, Vref1=0.27V, Vref3=0.3V. Moreover, the coefficients dlt_n were set as follows dlt_0=1.0, dlt_1=1.3, dlt_2=1.4, dlt_3=1.6.

The broken line showing "Enhanced gain of PA" in FIG. 4 results from increasing the power amplifier input according to coefficient dlt_1 to dlt_3.

Figure 8:
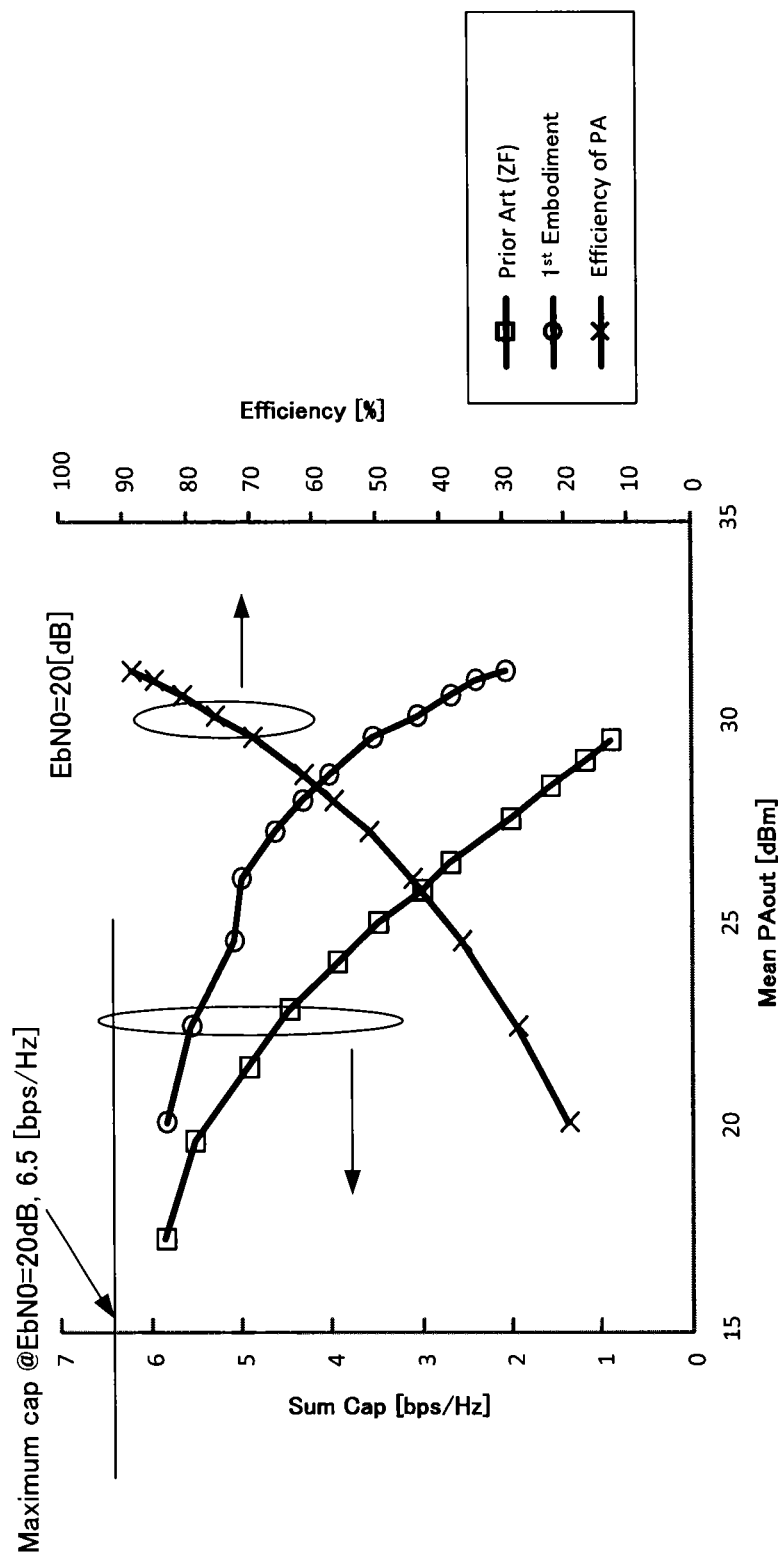
FIG. 8 is a of channel capacity and efficiency according to exemplary aspects of the present disclosure.

FIG. 8 is a graph for explaining the effect of first embodiment on channel capacity and efficiency. This graph is a result of simulation. The horizontal axis of FIG. 8 is an average power amplifier output in dBm, the left side vertical axis represents a channel capacity (Sum Cap [bps/Hz]), and the right side vertical axis represents the efficiency ([%]) of the power amplifier. The channel capacity (ZF) when not applying teachings of disclosure is represented by the plot identified with the square plot points, and the channel capacity for the case of overdrive where this teachings of the current disclosure were applied is the plot with the circle plot points (refer to the left vertical axis in connection with the latter two plots).

Noise in the receiving end was taken as $E_b/N_0$=20 dB. Here, $E_b/N_0$ represents noise electric power per energy ($E_b$)/1 Hz per 1 bit of reception ($N_0$). The channel capacity (sum-rate) in the case there is no nonlinear range under these assumptions was 6.5 bps/Hz. Moreover, the efficiency of the power amplifier is also plotted (refer to the right side vertical axis).

In FIG. 8, large capacity degradation is not seen until the output power level reaches 20 dBm. Up to 20 dBm the AM/AM the characteristic of the power amplifier can be considered linear. However, at outputs beyond 20 dBm, capacity deteriorates progressively with increasing output. However, when the output reaches 26 dBm, the sum capacity for the prior art system represented by the square plot points has deteriorated to 3 bps/Hz and the ratio of deterioration to 53%. On the other hand, at the same output power of 26 dBm the systems including the teachings of the present disclosure represented by the circle plot points has a sum capacity of 5 bps/Hz and a ratio of deterioration of 75%. That is, it turns out that interference is reduced by the teachings of the present disclosure. Moreover, by operating at that output power level one can attain a power amplifier efficiency of 40%.

Figure 9:
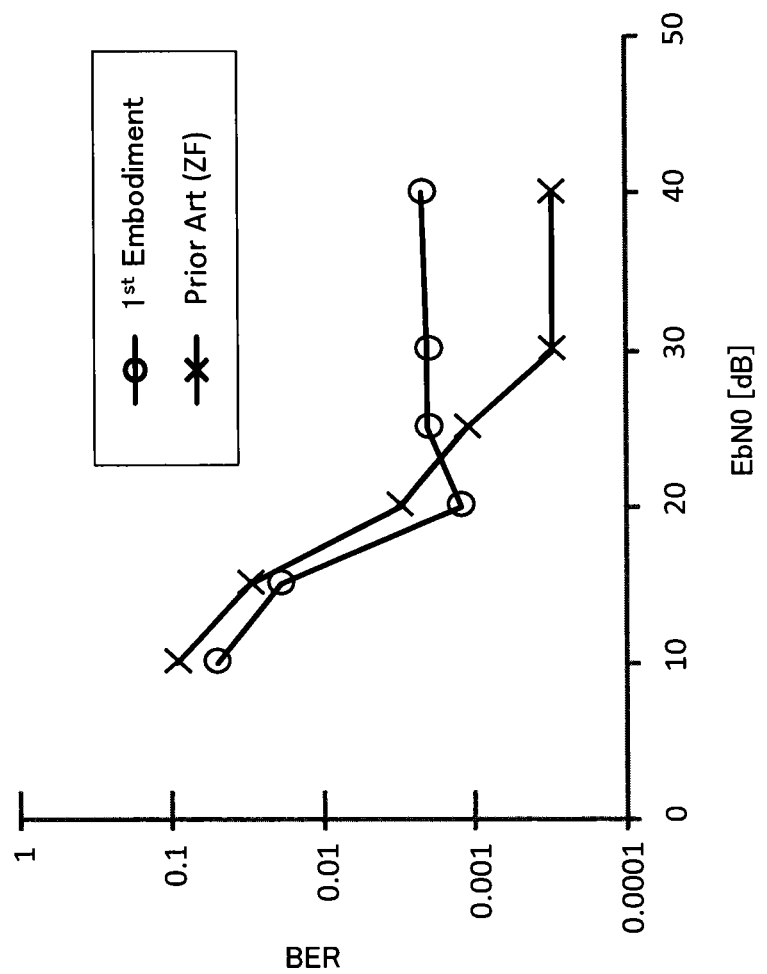
FIG. 9 is a graph of a bit error rate according to exemplary aspects of the present disclosure.

FIG. 9 is a graph for explaining another effect occurring in embodiments of the present disclosure. More specifically, it is a graph showing the $E_b/N_0$ dependence of the bit error rate (BER) before error correction. The horizontal axis represents $Eb/N_0$ [dB] and the vertical axis represents BER. The plot in the case of this embodiment ("1st Embodiment" in a figure) has the circle plot points. The plot for conventional (in the figure "Prior Art (ZF)") is identified by the X plot points. It turns out that an improvement in the BER is found by this embodiment. In addition, improvement is not found above $E_b/N_0$=30 dB. This is based on power amplifier distortion. In this embodiment, since power amplifier input is increasing partially, distortion increases. Since a distortion component has the same influence as noise, $E_b/N_0$ which involves the environmental reaches a level equivalent to the effect of distortion, and a distortion component becomes predominant after that. Therefore, $E_b/N_0$ dependence after it is lost.

For the prior art case, since distortion is about −35 dB, the fall of BER extends to higher $E_b/N_0$ levels. However, It becomes an $E_b/N_0$=−10 dB to −15 dB grade actually, From this, the behavior in these ranges does not become a problem, it is a problem in the range of $E_b/N_0$<20 dB, and the effectiveness of this embodiment is seen there.

Distortion is about −30 dBc in general in average adjacent channel leaking electric power ratio (ACPR: Adjacent Channel Power Ratio). When this is converted to absolute value, it is about −7 dBm at an antenna end (antenna output 23 dBm). Moreover, since all 100 power amplifiers do not transmit to the same direction, it can be said that it is not superimposed on this. On the other hand, since in the conventional case it is ACPR=−45 dBc in antenna output 43 dBm when one power amplifier per base station is used, for example (3GPP specification), distortion electric power will be about −2 dBm. In this embodiment, it is lower than this ACPR value. The present condition is maintainable even if distortion increases by this embodiment.

Figure 10:
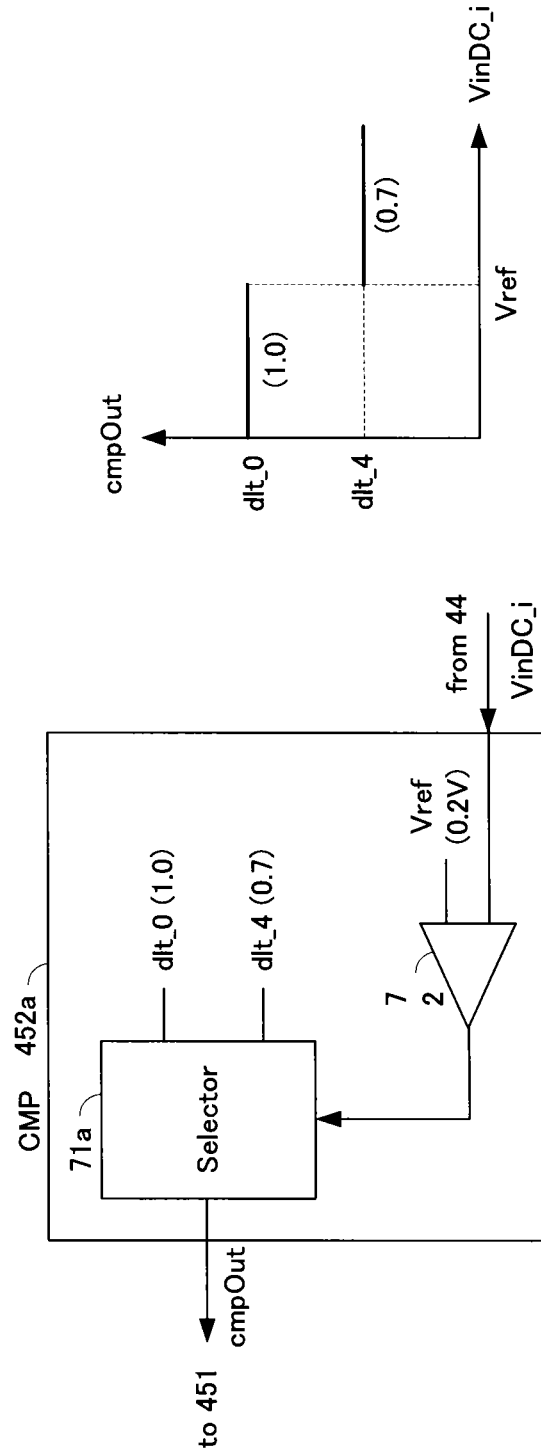
FIG. 10A is a block diagram of the structural example of a level comparator circuit included in FIG. 3 according to exemplary aspects of the present disclosure.
FIG. 10B is explanatory drawing of how the state of an output signal of the level comparator circuit shown in FIG. 10A changes in steps according to exemplary aspects of the present disclosure.

In the exemplary aspects the output of the low pass filter is compared to a single reference voltage Vref. In the example of FIG. 10 A Vref=0.2 V. A single predetermined constant value (here dlt_4=0.7) is used as the amplitude change coefficient aside from the default dlt_0=1.0 when the low pass filtered signal VinDC_i (i=1–100) is greater than or equal to Vref. Because Vref is fixed in the second embodiment a reference voltage generator circuit that generates multiple reference voltages is not needed.

Aside from the aforementioned difference in respect to the reference voltage generator circuit, and the change to the level comparator circuit 452a shown in FIG. 10, other parts of the second embodiment are the same as the first embodiment. In the second embodiment, the change coefficient cmpOUT has a default value of 1.0 (no change) but is changed to a value less than 1.0 when average value of input voltage exceeds a threshold value Vref input into comparator circuit 72. A selector 71a selects either the default value applied at a first of its signal inputs or a lesser value applied at another of its signal inputs depending on the result of the comparison of the low pass filtered signal VinDC_i performed by the comparator circuit 72. An output of the comparator circuit 72 is coupled to a control input of the selector 71a and the output signal of the comparator circuit serves as a selection signal input into a selection input of the selector 71a. The selected signal is passed to an output of the selector 71a which serves as an output of the level comparator circuit 452a, which is denoted cmpOut. As shown in FIG. 10B, the cmpOut signal output from comparator circuit 452 is a downward step function of VinDC_i with the downward step located VinDC_i=Vref. Thus, unlike in the first embodiment, in the second embodiment, when the low pass filter output VinDC_i exceeds the reference voltage Vref, the power amplifier input is temporarily reduced by the factor dlt_4 which is less than 1.0.

According to the exemplary aspects large signals can be temporarily shifted down to a portion of the power amplifier curve of FIG. 6 that is substantially linear. As a result, the suppression of a fundamental wave is reduced. In this case, when the decrease of PA input voltage is large, the decrease of the fundamental wave may also produce the situation of changing a channel. Although, in the second embodiment there is only a single step in the cmpOut, according to an alternative embodiment a plurality of reference voltages corresponding to a plurality of steps down in the cmpOut are implemented.

Figure 11:
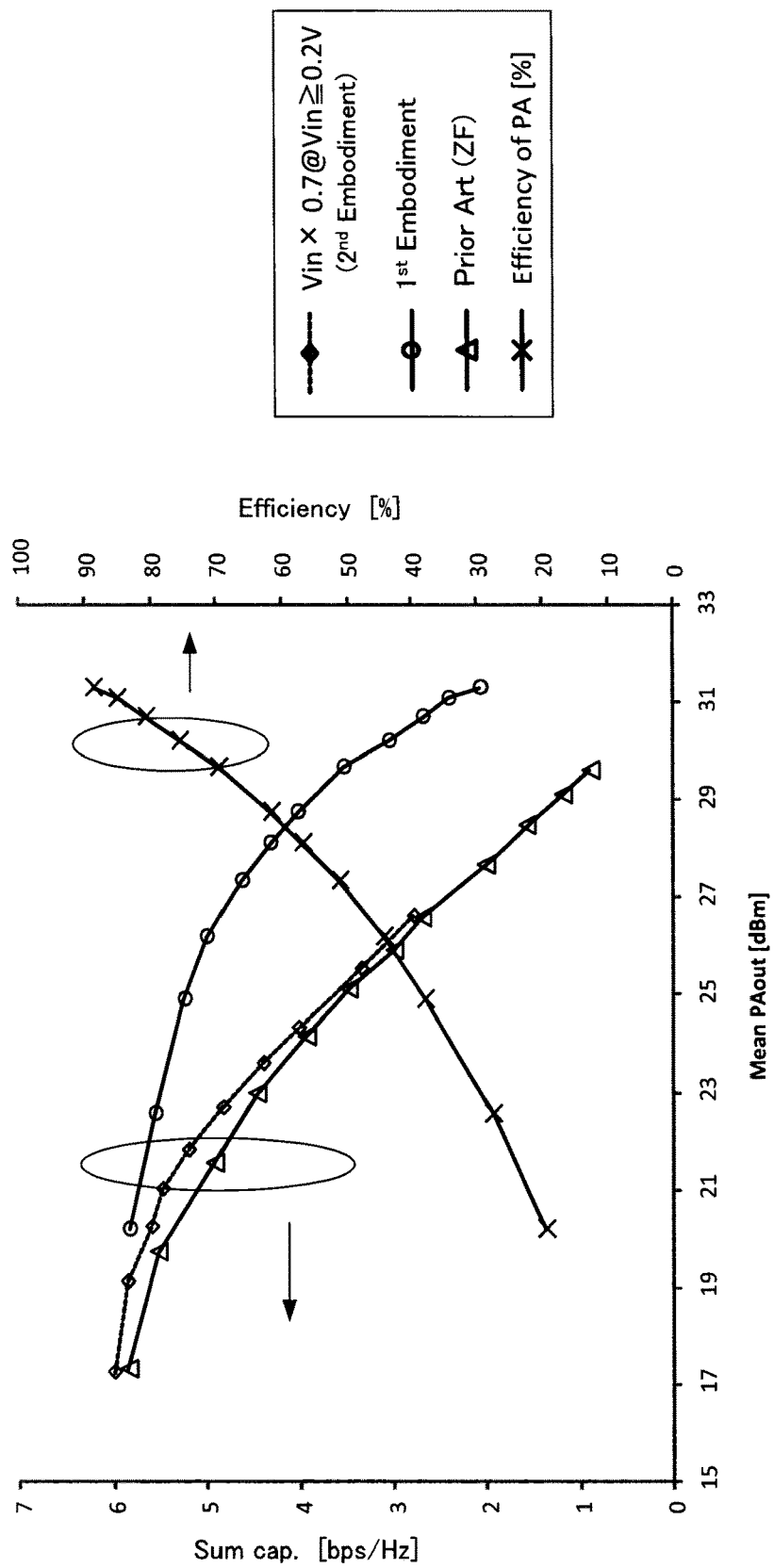
FIG. 11 is another graph of channel capacity according to exemplary aspects of the present disclosure.

The results of simulations to assess the channel capacity of the second embodiment are shown in FIG. 11. The system model is the same as discussed above. Compared with a conventional example, recovery of a channel capacity by application of this embodiment is seen from average output 17 dBm to 26 dBm.

Next, a way to effectively linearize a power amplifier circuit input-output relation is explained according to exemplary aspects. A linearization assumes the model in which an AM/AM characteristic and an AM/PM characteristic become a straight line to a saturation power. A fundamental wave suppression is avoided by this linearization.

Although separately linearizing each of many (e.g., 100) power amplifier circuits is possible, mass-production of power amplifier circuits with tight tolerances on characteristics is achievable. Therefore, linearization can be simplified by applying the same linearization technique uniformly across a large set of power amplifiers in a base station. Although many methods might be necessary to achieve linearization, when a temperature change and a load fluctuation are considered, an adaptive linearization is needed, and at the scale that would be needed in a massive MIMO transmitter it becomes very complicated and is not feasible. In the case of a base station, there is no load fluctuation, and it can assume that the terminal impedances are fixed at 50 ohms. Moreover, temperature is also well managed and there is little necessity to consider temperature variation. Therefore, it can be said that an adaptive linearization is unnecessary. In third embodiment, predistortion using a look-up table Look Up Table (LUT) is used to effectively linearize the power amplifier transfer function.

Figure 12A:
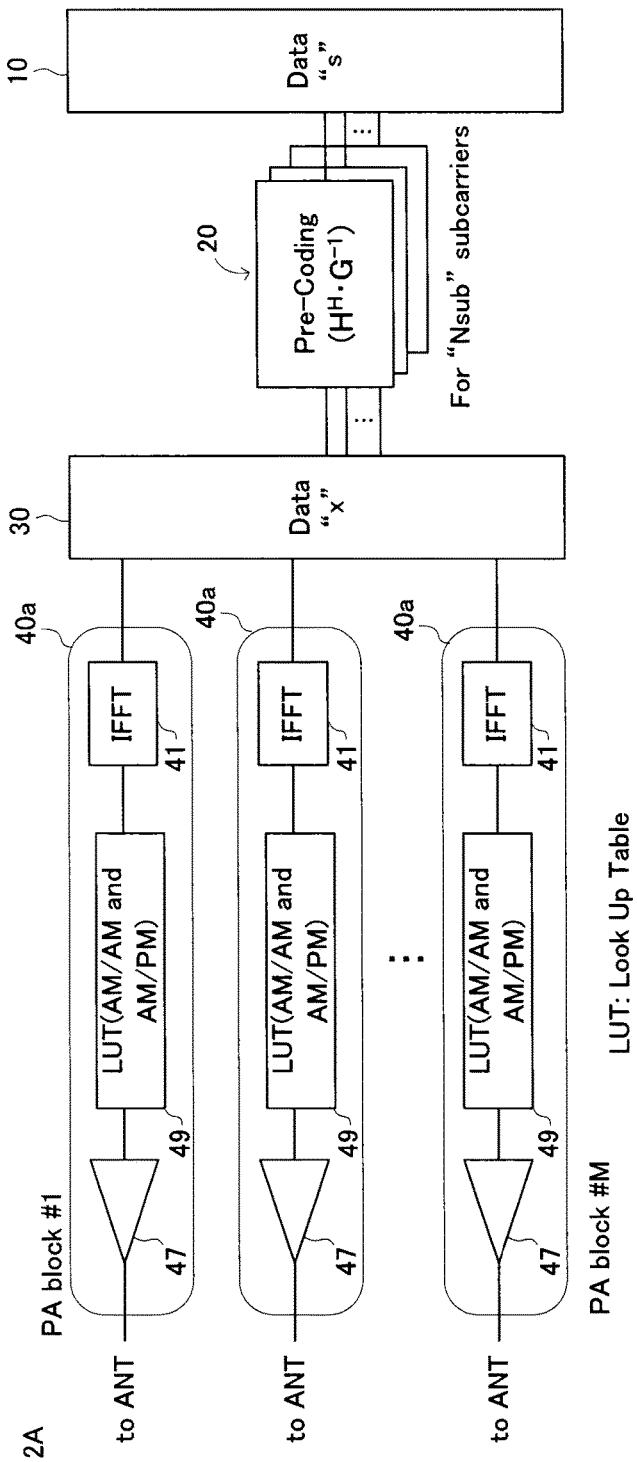
FIG. 12A is a block diagram of a schematic structure of the transmitter part of a base station according to exemplary aspects of the present disclosure.

FIG. 12A is a block diagram of a schematic structure of a transmitter circuit of a base station according to the third embodiment. Elements in FIG. 12 which share references numerals with the figures described above have similar functionality and a description thereof is omitted hereinbelow. In FIG. 12A, the signal input to power amplifier circuit block 40a is the same as in the case of FIG. 2.

A Look Up Table (LUT) 49 is inserted between the IFFT 41 and the power amplifier circuit 47 inside the power amplifier circuit block 40a. Using this LUT 49, the signal voltage output from IFFT 41 is pre-compensated, and then supplied to the to the power amplifier 47. That is, when the average value of the input voltage of power amplifier circuit 47 is beyond a predetermined reference value, the LUT 49 (LUT) performs a pre-compensation process for each power amplifier 47 so that the amplitude of input voltage may be changed according to predetermined amplitude change rate.

Figure 12B:
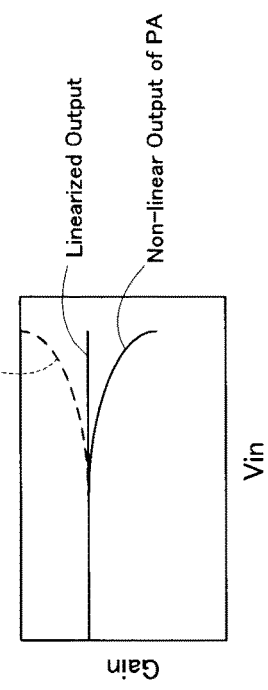
FIG. 12B is the graph of the working of a Look Up Table (LUT) used in the system shown in FIG. 12A according to exemplary aspects of the present disclosure.

FIG. 12B is a graph in which the vertical axis is gain and the horizontal axis is input voltage. The graph includes three plots which are approximately equal up until the voltage reaches a point at which a subject power amplifier response deviates from linear. The lower plot shows the non-linear gain of the power amplifier circuit which drops below the uniform linear at the aforementioned point. The middle plot represents the ideal linear response, and the upper plot represents the pre-compensation factor which is effectively embedded in the LUT in order to effectively linearize the gain of the power amplifier. Although an illustration is omitted, another LUT can be used to correct phase distortion.

The LUT 49 in the above descriptions is the same for all of the power amplifier circuit blocks in each massive MIMO base station. However when the characteristic differences among the power amplifiers are large, a separate LUT 49 which has a different transfer characteristic for every power amplifier circuit may be prepared.

Figure 13:
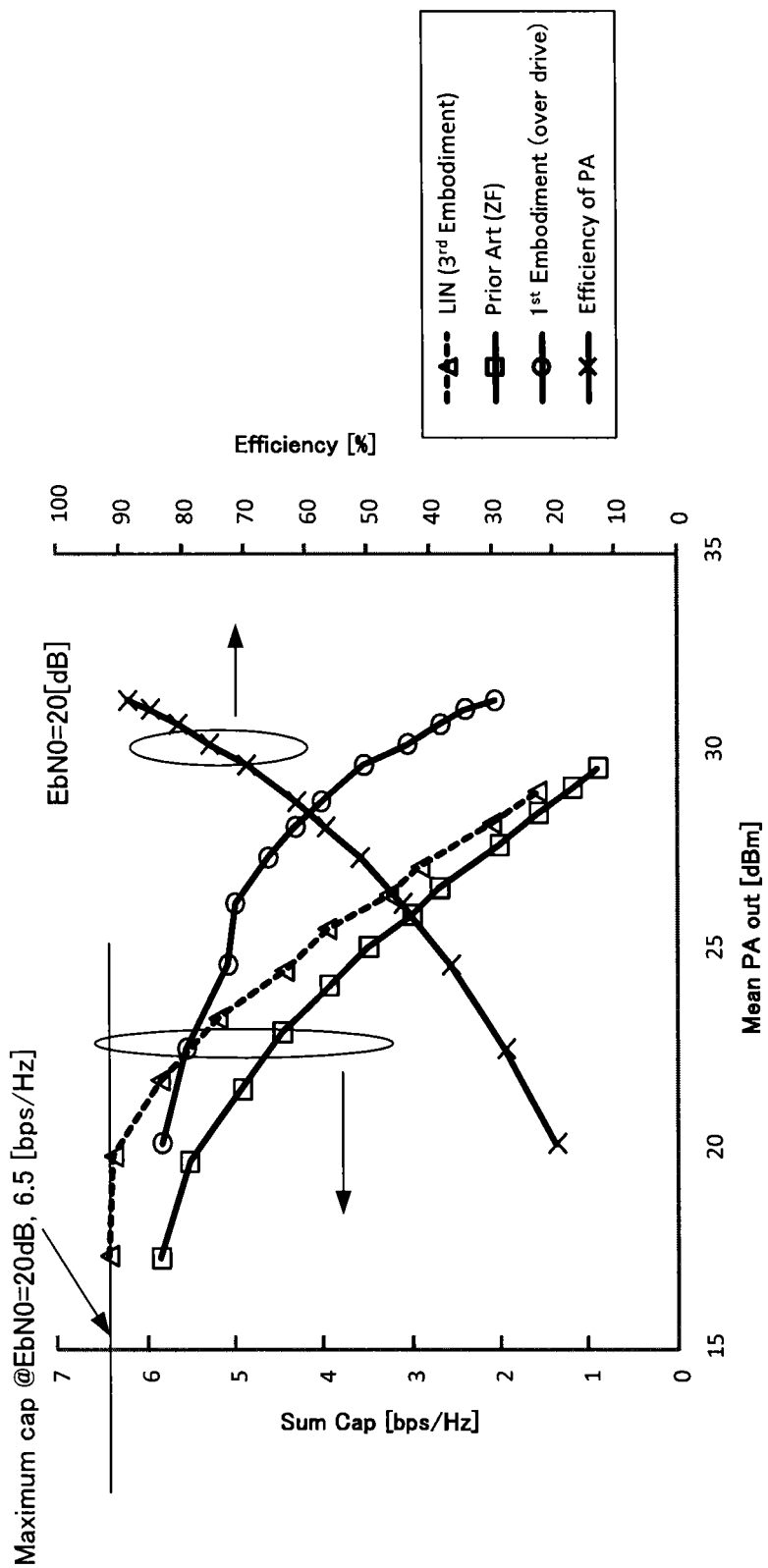
FIG. 13 is a graph of the simulation result according to exemplary aspects of the present disclosure.

FIG. 13 is a simulation result according to exemplary aspects of the present disclosure. The graph "LIN" identified by the triangle plot symbols in FIG. 13 shows an exemplary power amplifier circuit as described above. For a comparison, the other graphs shown in FIG. 8 are also shown in FIG. 13. The linearization performed yields an improvement of the channel capacity relative to the prior art example (ZF) which is manifested in FIG. 13. Due to hard clipping associated with linearization the amount of improvement falls off in a high-output region. That is, since an output level exceeding the saturated level of the power amplifier cannot be generated, the output voltage exceeding a saturated level is clipped and this causes waveform distortion. This phenomenon is due to the inherent capability of power amplifier and cannot be avoided.

When the 26 dBm output point mentioned above is reached, in the case of the third embodiment (LIN), the sum capacity of the third embodiment has deteriorated even in 4 bps/Hz, and the ratio of deterioration is 61%. In ZF, it turns out that the sum capacity has degraded to 3 bps/Hz and interference is reduced by this embodiment compared with the ratio of deterioration being 53%.

According to exemplary aspects of this disclosure, signal suppression can be recovered by increasing the input to a power amplifier in which the suppression of a signal voltage occurs, and the effect of the zero forcing for interference removal can be recovered. Thus small size and low-cost and highly efficient power amplifiers for terminals can be used for the base stations of massive MIMO systems.

According to this disclosure, the following methods and apparatus are presented:

(1)
The power amplifier circuit blocks which contain a power amplifier are provided, wherein: each power amplifier circuit block has;

a low-pass filter (LPF) which generates the average value of the input voltage, and a level adjustment part by which the amplitude of the said input voltage is changed when the average value of the input voltage is beyond a predetermined reference value.

(2)
The power amplification apparatus for massive MIMO base stations described in (1) wherein: the level adjustment part has:

a comparator circuit by which the average value of the input voltage obtained by the LPF is compared with a predetermined reference value, and a multiplier to which the amplitude of the said input voltage is changed according to predetermined amplitude change rate according to the output of the said comparator circuit when the average value of the said input voltage is beyond the said reference value.

(3)
The power amplification apparatus for massive MIMO base stations described in (2) wherein: when the average value of the said input voltage is beyond the said reference value, the coefficient according which said input voltage is made to increase is used for the multiplier as the amplitude change rate.

(4)
The power amplification apparatus for massive MIMO base stations described in (1) wherein: based on the output of multiple low pass filters of multiple power amplifier circuit blocks, the average value of all the input voltages of the power amplifiers is calculated, and this calculated average value is used as the reference value.

(5)
The power amplification apparatus for massive MIMO base stations described in (4) wherein: a set of reference values is generate which have a predetermined voltage difference centering around the average value of all the input voltages of the power amplifiers.

(6)
The power amplification apparatus for massive MIMO base stations described in (5) wherein: the coefficient to which said input voltage is made to increase is switched between value "1", and at least one predetermined value larger than "1", according to whether the average value of the said input voltage is in a predetermined input voltage ranges defined by reference values.

(7)
The power amplification apparatus for Massive MIMO base stations described in (2) wherein:

when the average value of the input voltage is beyond the reference value, the multiplier uses a coefficient which decreases the input voltage as the amplitude change rate.

(8)
The power amplification apparatus for Massive MIMO base stations described in (7) with which said coefficient includes less than one predetermined positive value.

(9)
The power amplification apparatus for Massive MIMO base stations described in (8) wherein:

the average value of the said input voltage is included among the some input voltage used to determine the reference value, and the said coefficient is changed in steps between value "1", and at least 1 predetermined value smaller than "1".

(10)
A plurality of power amplifier circuit blocks each of which includes a power amplifier is provided, wherein:

each power amplifier circuit block has a linearization process part which performs a linearization process for the power amplifier so that the amplitude of the input voltage may be changed according to a predetermined amplitude change rate when the average value of the input voltage of the said power amplifier is beyond a predetermined reference value.

(11)
The power amplification apparatus for Massive MIMO base stations described in (10) in which said linearization process part gives predistortion to the said input voltage.

(12)
The power amplification apparatus for Massive MIMO base stations described in (11) in which the said linearization process part has a look-up table which produces the predistortion.

(13)
The power amplification apparatus for Massive MIMO base stations described in (12) using the internal data which define the same input-output transfer characteristic as said some look-up table within these power amplifier circuit blocks.

(14)
A Multi-Input Multi-Output base station comprising:
  a plurality of transmitter blocks, each including
  a time-domain base band signal source circuit configured to generate an output;
  a low pass filter circuit coupled to the base band source circuit and configured to filter the output of the base band source circuit; and
  a signal level adjuster circuit coupled to the base band signal source circuit and the low pass filter and configured to adjust the output of the base band signal source circuit based on an output of the low pass filter.

(15)
The Multi-Input Multi-Output base station described in (14), wherein the output of the base band signal source circuit is coupled to a signal input of the signal level adjuster circuit, the output of the low pass filter circuit is coupled to a control input of the signal level adjuster circuit, and an output of the signal level adjuster corresponds to an adjusted output of the base band signal source circuit.

(16)
The Multi-Input Multi-Output base station described in any one of (14) or (15) wherein the signal level adjuster circuit further comprises:
  a reference voltage generator circuit configured to generate a reference voltage;
  signal multiplier circuit configured to generate a plurality of multiplier signals; and
  circuitry configured to determine a multiplier signal of the plurality of multiplier signals generated by the signal multiplier circuit with which to adjust the output of the base band signal source circuit based on the output of the low pass filter circuit.

(17)
The Multi-Input Multi-Output base station described in (16), wherein the circuitry includes a comparator circuit configured to compare an output of the low pass filter circuit to the reference voltage, and a selector circuit configured to select one of the plurality of multiplier signals based on an output of the comparator circuit.

(18)
The Multi-Input Multi-Output base station described in (16) or (17) wherein a first of the plurality of multiplier signals is greater than a second of the plurality of multiplier signals.

(19)
The Multi-Input Multi-Output base station described in (18), wherein the circuitry is configured to select the second of the plurality of multiplier signals when the output of the low pass filter circuit is greater than the reference voltage.

(20)
The Multi-Input Multi-Output base station described in (18) or (19), wherein the circuitry is configured to select the second of the plurality of multiplier signals when the output of the low pass filter circuit is greater than the reference voltage.

(21)
The Multi-Input Multi-Output base station described in (16), wherein the signal level adjuster circuit is configured to adjust the output of the base band signal source circuit using a look up table of predetermined compensation values.

(22)
The Multi-Input Multi-Output base station described in (21), wherein each of the transmitter blocks further include a power amplifier circuit, and the compensation values in the look-up table compensate for nonlinearity in the power amplifier circuit.

(23)
The Multi-Input Multi-Output base station described in any of (14) to (22), wherein the signal level adjuster circuit is further configured to receive an output from at least one other transmitter block.

(24)
The Multi-Input Multi-Output base station described in (21) further comprising:
  a pre-coder circuit coupled to a data source and configured to pre-code data from the data source according to the following equation $$X = H^H * G^{-1} * S$$

where H is a channel matrix
  $H^H$ is a conjugate transpose of the channel matrix;

$$G = H * H^H$$

$G^{-1}$ is the inverse of G.

(25)
A Multi-Input Multi-Output system, comprising:
  circuitry configured to
  generate an output signal,
  low pass filter the output signal to generate a filtered output signal; and
  adjust the output signal based on the filtered output signal.

(26)
The Multi-Input Multi-Output system described in (25), wherein the circuitry is further configured to
  generate a reference voltage,
  generate a plurality of multiplier signals, and
  determine one of the plurality of multiplier signals with which to adjust the output signal based on the filtered output signal.

(27)
A method for each of a plurality of transmitter blocks in a Multi-Input Multi-Output base station, comprising:
  generating, with circuitry, a reference voltage;
  generating, with the circuitry, a plurality of multiplier signals; and
  determining, with the circuitry, one of the plurality of multiplier signals with which to adjust the output signal based on the filtered output signal.

(28)
The method described in (27), further comprising:
generating, with the circuitry, a reference voltage;
generating, with the circuitry, a plurality of multiplier signals; and
determining, with the circuitry, one of the plurality of multiplier signals with which to adjust the output signal based on the filtered signal.

(29)
The Multi-Input Multi-Output base station described in any one of (14) to (24), wherein the base station includes at least one hundred transmitter blocks.

As mentioned above, although preferred embodiment of this disclosure were described, it is possible to make various modification and changes other than those mentioned above. That is, it is understood that various modifications, combinations, and other embodiment may naturally arise for those skilled in the art with a design or another element as long as it exists in claims or a range equal to claims.

Thus, the foregoing discussion describes exemplary embodiments of the present disclosure. As will be understood by those skilled in the art, other of the inventive features described herein may be made and/or practice without departing from the spirit or essential characteristics thereof. Accordingly, the present disclosure is intended to be illustrative, but not limiting. The disclosure, including any readily discernible variants of the descriptions herein, defines, in part, the scope of the foregoing claim terminology such that no inventive subject matter is dedicated to the public.

The invention claimed is:

1. A Multi-Input Multi-Output system, comprising:
a plurality of transmitter blocks, each including circuitry configured to
generate an output signal,
low pass filter the output signal to generate a filtered output signal,
receive a plurality of reference voltages each based on an average value of the filtered output signal and filtered output signals from each of the other transmitter blocks in the plurality of transmitter blocks,
compare the filtered output signal with the plurality of reference voltages to produce a result of comparison,
generate a plurality of multiplier signals,
select one of the plurality of multiplier signals based on the result of comparison, and
adjust the output signal by multiplying the output signal by the selected one of the plurality of multiplier signals.

2. The Multi-Input Multi-Output system according to claim 1, wherein the circuitry is further configured to generate the plurality of multiplier signals each corresponding to one of the plurality of reference voltages.

3. A method for each of a plurality of transmitter blocks in a Multi-Input Multi-Output base station, comprising:
generating, with circuitry, an output signal;
low pass filtering, with the circuitry, the output signal to generate a filtered output signal;
receiving, with the circuitry, a plurality of reference voltages each based on an average value of the filtered output signal and filtered output signals from each of the other transmitter blocks in the plurality of transmitter blocks;
comparing, with the circuitry, the filtered output signal with the plurality of reference voltages to produce a result of comparison;
generating, using the circuitry, a plurality of multiplier signals,
selecting, using the circuitry, one of the plurality of multiplier signals based on the result of comparison, and
adjusting, using the circuitry, the output signal by multiplying the output signal by the selected one of the plurality of multiplier signals.

4. The method according to claim 3, wherein the generating the plurality of multiplier signals generates the plurality of multiplier signals to each correspond to one of the plurality of reference voltages.

5. A Multi-Input Multi-Output base station comprising:
a plurality of transmitter blocks, each including circuitry configured to
generate an output signal,
low pass filter the output signal to generate a filtered output signal,
receive a plurality of reference voltages each based on an average value of the filtered output signal and filtered output signals from each of the other transmitter blocks in the plurality of transmitter blocks,
compare the filtered output signal with the plurality of reference values to produce a result of comparison,
generate a plurality of multiplier signals,
select one of the plurality of multiplier signals based on the result of comparison, and
adjust the output signal by multiplying the output signal by the selected one of the plurality of multiplier signals.

6. The Multi-Input Multi-Output base station according to claim 5, wherein a first of the plurality of multiplier signals is greater than a second of the plurality of multiplier signals.

7. The Multi-Input Multi-Output base station according to claim 6, wherein the circuitry is configured to select the second of the plurality of multiplier signals when the average output signal is greater than the reference voltage.

8. The Multi-Input Multi-Output base station according to claim 5, wherein the circuitry is configured to adjust the output signal using a look up table of predetermined compensation values.

9. The Multi-Input Multi-Output base station according to claim 8, wherein each of the transmitter blocks further include a power amplifier circuit, and the compensation values in the look-up table compensate for nonlinearity in the power amplifier circuit.

10. The Multi-Input Multi-Output base station according to claim 8, further comprising:
pre-code data S from a data source to produce pre-coded data X according to the following equation $$X = H^H * G^{-1} * S$$

where H is a channel matrix
$H^H$ is a conjugate transpose of the channel matrix;

$$G = H * H^H$$

$G^{-1}$ is the inverse of G.

11. The Multi-Input Multi-Output base station according to claim 5, wherein the circuitry is further configured to receive an output from at least one other transmitter block.

12. The Multi-Input Multi-Output base station according to claim 5, wherein the base station includes at least one hundred transmitter blocks.

13. The Multi-Input Multi-Output base station according to claim 5, wherein the circuitry is further configured to generate the plurality of multiplier signals each corresponding to one of the plurality of reference voltages.

* * * * *